United States Patent [19]

Nishitoba et al.

[11] 4,013,972
[45] Mar. 22, 1977

[54] AMPLIFIER WITH GAIN CONTROL MEANS

[75] Inventors: Shigeo Nishitoba; Kazuo Tokuda, both of Tokyo, Japan

[73] Assignee: Nippon Electric Company, Ltd., Tokyo, Japan

[22] Filed: May 3, 1976

[21] Appl. No.: 682,799

[30] Foreign Application Priority Data

May 7, 1975   Japan .............................. 50-55719

[52] U.S. Cl. ................................. 330/29; 330/22; 330/30 D
[51] Int. Cl.² .......................................... H03G 3/30
[58] Field of Search ................... 330/22, 29, 30 D

[56] References Cited

UNITED STATES PATENTS

| | | | |
|---|---|---|---|
| 3,641,450 | 2/1972 | Lunn .............................. | 330/29 X |
| 3,684,974 | 8/1972 | Solomon et al. ................ | 330/30 D |

*Primary Examiner*—Rudolph V. Rolinec
*Assistant Examiner*—Lawrence J. Dahl
*Attorney, Agent, or Firm*—Hopgood, Calimafde, Kalil, Blaustein & Lieberman

[57] ABSTRACT

A gain controllable amplifier of the present invention comprises a first and a second differential amplifier. The first differential amplifier serves as an amplifier for an input signal to be impressed on emitters connected in common with each other, while the second differential amplifier serves as a base bias voltage control circuit of the first differential amplifier. The bias voltage derived from the second differential amplifier is changed by a D.C. bias voltage applied to the bases of the respective transistors in the second differential amplifier. The connected to the respective output terminals of the second differential amplifier are transistors whose bases receive a constant voltage. The gain of the first differential amplifier can be controlled by adjusting the D.C. bias voltage applied to the second differential amplifier. The present invention further comprises two current supply circuit each connected to the aforesaid respective output terminals of the second differential amplifier. When one of the transistors in the second differential amplifier is brought into a cutoff condition, the base bias voltage on the first differential amplifier is supplied directly through a current supply circuit. As a result, a variable range of the base voltage on the second differential amplifier is becomes wider, with a resulting increase in the gain control range of the first differential amplifier, thereby achieving increased attenuation of gain. The amplifier according to the present invention is suited for use as a gain control circuit especially for an audio circuit which requires attenuation to a great degree.

5 Claims, 6 Drawing Figures

AMPLIFIER WITH GAIN CONTROL MEANS

FIELD OF THE INVENTION

This invention relates to a gain-controllable amplifier which is suitable for use in electric equipments in a television receiver, audio equipments and so forth.

BACKGROUND OF THE INVENTION

A recently developed, gain-controllable amplifier whose gain is controlled by adjusting a D.C. bias voltage dispenses with shield wires between the amplifier and the variable resistor for controlling the D.C. bias voltage without any fear of crosstalk of electric signals. The conventional gain-controllable amplifier comprises a differential amplifier stage. An input signal is applied to the commonly connected emitters of the transistors of the differential amplifier, and the bias potentials applied to the bases of the respective transistors in the differential amplifier are varied manually, with the results in variation of the collector currents of both the transistors and in variation of gain of the output derived from the collectors of the transistors. For varying base bias potential, there have been proposed two types of attempts. One of these uses a circuit including a transistor with the base on which a potential divided by fixed and variable resistors is to be impressed, and a resistor connected to the emitter of this transistor, so that a base bias potential for the differential amplifier is derived from the emitter. Another of these uses another differential amplifier having load transistors, whose bases receive a constant potential, and whose emitters are connected to the respective collectors of another differential amplifier. The base of one of the transistors of another differential amplifier is supplied with a constant potential, while the base of the other is supplied with a potential controlled by a resistor divider. The output potential of the transistors of another differential amplifier receiving the input signal via base-emitter junction of additional transistors.

In the former case, a variable resistor is used as a resistance-dividing means for controlling a potential on the base of a transistor, thereby varying a dividing ratio of the power voltage. However, this resistance dividing means is attended with a base voltage whose value abruptly changes at a given value, the aforesaid base voltage being interrelated to the variation in resistance of the aforesaid variable resistor. As a result, adjustment of gain may be feasible only within a small allowable range of variation in resistance. On the other hand, in the latter case, gain varies linearly or in proportion of the variation in resistance across the dividing point thereof, thus permitting easy adjustment of the gain, while suffering from a narrower range of the gain adjustment.

SUMMARY OF THE INVENTION

It is an object of the present invention to provide a gain-controllable amplifier which allows a wide range of adjustment, easy adjustment of the gain, and no fear of crosstalks.

According to the present invention, there is provided a gain-controllable amplifier which comprises: a source of power supply voltage; a first differential amplifier including a first pair of transistors, the emitters of which are commonly connected with each other and at least one of the collectors of which connects with a load, and means for impressing an input signal on the emitters thus commonly connected; and a second differential amplifier including (i) first and second resistors inserted between the respective bases of the first pair of transistors, and an earth potential, respectively, (ii) first and second transistors, respective emitters of which are connected with respective junctions of the first and second resistors to the respective bases of the first pair of transistors, (iii) a second pair of transistors whose emitters are electrically coupled to each other, and (iv) third and fourth transistors, the respective emitters of which are connected with the respective collectors of the second pair of transistors, the respective bases of the third and fourth transistors being connected with each other; a constant voltage source connected with both the bases of the third and fourth transistors; first and second current sources each supplying a current to the respective bases of the first and second transistors; a reference voltage generating circuit which impresses a reference voltage on the base of one of the second pair of transistors; and means for adjusting the base bias voltage of the other transistor of the second pair of transistors.

With the gain-controllable amplifier of this invention, there may be obtained a gain which varies in proportion to a voltage change of the means for adjusting the base bias voltage, resulting in no possibility of abrupt change in gain obtained, thus allowing ready adjustment of the gain.

Furthermore, even in case either one of the second pair of transistor is brought into a cut-off condition, base currents required for the first and second transistors may be supplied thereto through the current source. This results in a wide range of gain control, while maintaining the variation in gain in proportion to the change of the base bias voltage amplified to the other base of the second pair of transistors.

Additional objects and features of the invention will appear from the following description, in which some preferred embodiments are set forth in detail in conjunction with the accompanying drawings.

Figure 1:
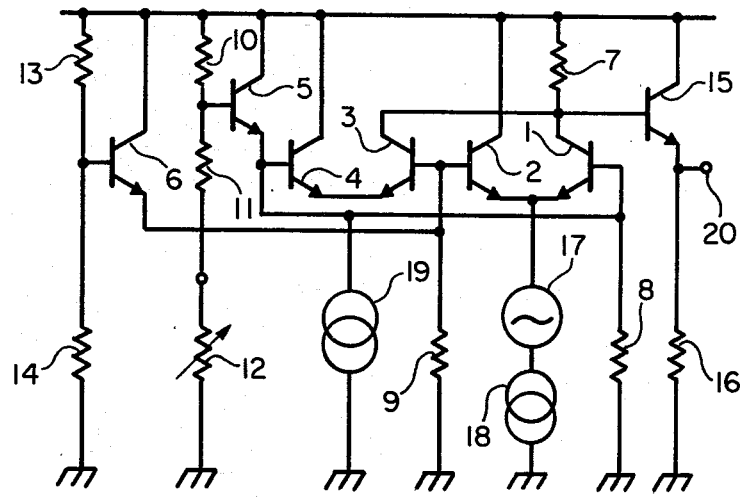
FIGS. 1 and 2 are circuit diagrams of the conventional gain-controllable amplifiers.
Figure 2:
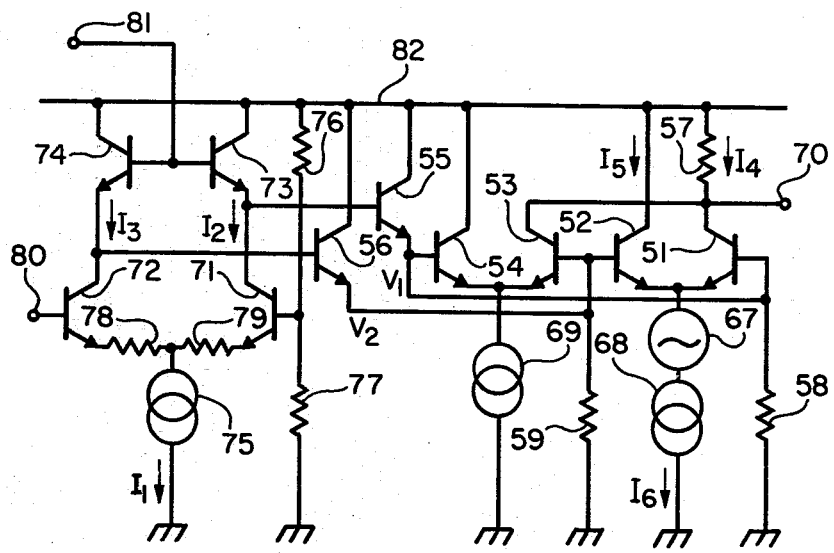

Before describing preferred embodiments of the present invention, some conventional gain-controllable amplifiers will be briefly reviewed with reference to FIGS. 1 and 2.

Referring now to FIG. 1, both emitters of transistors 1 and 2 are commonly connected with each other, while a constant current source 18 and a signal source 17 are connected between the emitters of the transistors 1,2 and earth potential. A signal from the signal source 17 is taken out by way of a resistor 7 serving as a load, then transmitted to an emitter follower circuit consisting of a transistor 17 and a resistor 16, and then taken out from an output terminal 20 as an output signal. The base bias voltages on the transistors 1,2 are supplied by resistors 8,9 and transistors 5,6. The base bias for the transistor 6 is a divided voltage of a source voltage by resistors 13,14, while the base bias for the transistor 5 is by resistor 10,11 and variable resistor 12. Variation in resistance of the variable resistor 12 varies the operational resistance between the collector and emitter of the transistor 5 and then changes the base bias voltage of the transistors 1 and 2, resulting in a change of the ratio in amount of currents flowing through the transistors 1 and 2. It follows from this that gain obtained at the output terminal 20 varies commensurately to the amount of a collector current in the transistor 1.

The differential amplifier consisting of transistor 3,4 and a constant current source 19 is so compensated that the D.C. voltage obtained at the collector of the transistor 7 will not vary, when the gain of the amplifier is varied.

Figure 4:
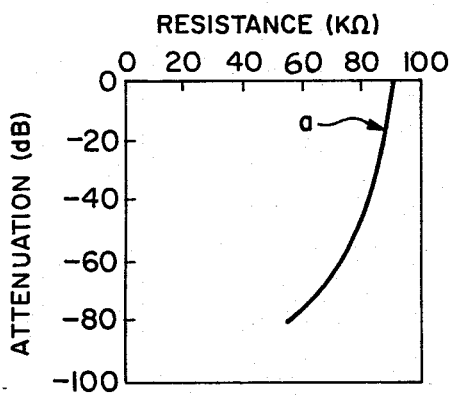
FIGS. 4 and 5 are graphs, in which attenuations of the amplifiers shown in FIGS. 1 and 3 are plotted against resistances.

FIG. 4 is a graph showing a typical characteristic of an output of the amplifier in FIG. 1, and resistance of the variable resistor 12, in which the resistance of the variable resistor 12 is represented by an abscissa, and the attenuation (dB) from the maximum value of an output is represented by an ordinate. The point $a$ represents a point where the output is reduced to half. As can be seen from this, the change in the base potential of the transistor 5 makes an abrupt change of the gain in the neighborhood of a threshold voltage of the transistor 5. Accordingly, in case such a gain controllable amplifier is adopted as a volume control circuit for an audio circuit in a radio receiver or a television receiver, one may find extreme difficulty in manually adjusting the valume of sound.

Furthermore, when an amplifier shown in FIG. 1 is constructed in a semi-conductor integrated circuit, a base bias voltage on the transistor 6 depends on a ratio of the resistance of a diffusion resistor 13 to that of a diffusion resistor 14, whereas a base bias voltage on the transistor 5 is governed by a ratio of resistances of a diffusion resistor 10 to that of a diffusion resistor 11 and a variable resistor 12. The variable resistor 12 is made of carbon resistor and compelled to be added to the integrated circuit. Such diffusion resistor in the interior of an integrated circuit is different from the external carbon resistor in temperature coefficient of the resistance value, resulting in a shortcoming in that the variation in ambient temperature necessarily leads to variation in output gain.

Another conventional circuit shown in FIG. 2 is disclosed in the U.S. Pat. No. 3,742,128 issued on June 26, 1973 to Wakai et al. Reference numerals 51 to 59, and 67 to 70 designate the same parts as those indicated at 1 to 9 and 17 to 20 in FIG. 1, and the reference numerals in FIG. 2 are shown by adding 50 to those shown in FIG. 1 for representing like parts.

Base voltages on transistors 55,56 are supplied from a differential amplifier including transistors 71 to 74, a constant current source 75, resistors 76 to 79, a constant voltage supply terminal 81 and a control voltage impressing terminal 80. When a D.C. control voltage is impressed on a control voltage impressing terminal 80, this conventional amplifier will be operated in the following manner.

Since the base bias voltage on transistor 71 is governed by resistors 76,77, and a controlling D.C. voltage being impressed on a terminal 80 is impressed on the base of a transistor 72, collector currents in transistors 71,72 will flow as given divisions of a current $I_1$ which is generated by a constant current source 75.

Assume now the emitter voltages $V_1, V_2$ of transistors 55,56, respectively. Then, $V_1$ and $V_2$ may be expressed by the following equations:

$$V_1 = V_0 - V_{BE73} - V_{BE55} \quad (1)$$

$$V_2 = V_0 - V_{BE74} - V_{BE56} \quad (2)$$

where $V_0$ represents a voltage impressed on a terminal 81, i.e., a common base voltage on transistors 73,74, $V_{BE55}$, $V_{BE56}$, $V_{BE73}$, and $V_{BE74}$ represent respectively base-emitter voltages of transistors 55,56,73 and 74.

In this amplifier, the emitter currents of the transistors 55 and 56 will be approximately equal. Therefore, if the resistance values of the emitter resistors 58,59 are taken as being equal, the base-emitter voltage $V_{BE55}$ will be almost equal to $V_{BE56}$. As a result, the difference in emitter voltage between $V_1$ and $V_2$, i.e., voltage difference between the bases of transistors 51 and 52, will be given by the equation (3) below:

$$V_1 - V_2 = V_{BE74} - V_{BE73} \quad (3)$$

In general, the base-emitter voltage $V_{BE}$ of a transistor and the emitter current Ie satisfy the following equation:

$$V_{BE} = \frac{kT}{q} \ln\left(\frac{Ie}{Is} + 1\right) \cong \frac{kT}{q} \ln \frac{Ie}{Is} \quad (4)$$

where
Is : saturation current in transistor
K : boltzmann's constant
T : absolute temperature
q : charge of electron Accordingly, the relationship between the right side of the equation (3), i.e., the base-emitter voltage of transistors 73,74 and the emitter currents $I_2$, $I_3$ will be given as follows:

$$V_{BE74} - V_{BE73} = \frac{kT}{q} \ln \frac{I_3}{I_2} \quad (5)$$

where
$I_2$ : collector current in transistor 71
$I_3$ : collector current in transistor 72.
Likewise, the left side of the equation will be given as follows:

$$V_1 - V_2 = \frac{kT}{q} \ln \frac{I_4}{I_5} \quad (6)$$

where
$I_4$ : collector current in transistor 51
$I_5$ : collector current in transistor 52.
The following equation may be established from the equations (3), (5) and (6):

$$\frac{I_3}{I_4} = \frac{I_4}{I_5} \quad (7)$$

It can be seen from the equation (7) that the current ratio $I_4/I_5$, i.e., collector current $I_4$ in the transistor 51 to the collector current $I_5$ in the transistor 52 is equal to the current ratio $I_3/I_2$, i.e., the collector current $I_3$ in the transistor 72 to the collector current $I_2$ in the transistor 71. As a result, the gain of an output obtained at the output terminal 70 may be controlled by a D.C. voltage being impressed on one of input terminals of the differential amplifier comprising transistors 71 to 74, i.e., on a control voltage impressing terminal 80.

If the resistance of a resistor 78 is designed to be sufficiently large so that the current $I_3$ may be governed by a control voltage to be impressed on the voltage impressing terminal 80, the gain obtained at the output terminal 70 varies in proportion to the variation in this control voltage. In addition to the above design, the control voltage is obtained by dividing the power supply voltage by use of resistor divider such as variable resistor, the output gain will vary in proportion to the variation in resistance.

Accordingly, there is no fear of the output gain being abruptly varied relative to variation in control voltage, so that the adjustment of gain may be readily achieved and the manual fine adjustment will not be attended with any difficultly.

However, those advantages may be achieved only in case neither of transistors is saturated. Thus, in case either one of transistors 71 and 72 reaches a saturated state, the collector current $I_2$ or $I_3$ of the transistor 71 or 72 can no longer supply a sufficient base current to the transistor 55 or 56, then the transistor 73 or 74 will supply a current required for the transistor 55 or 56, irrespective of the collector current $I_2$ or $I_3$ of transistor 71 or 72. As a result, the equation (5) can no longer be established, nor can be the equation (7). It follows that the operating state of the amplifier having a gain controllable action is limited to the case where both of the transistors 71 and 72 are not saturated. When either one of transistors 71 and 72 is saturated, an output gain remains constant and can no longer be controlled.

As is clear from this, a gain controllable range of the amplifier is narrow, covering the values only in the neighborhood of 40dB. Such a narrow range is not sufficient for an audio circuit. Even is a sufficient output is obtained, there may not be obtained a sufficiently attenuated output.

Figure 3:
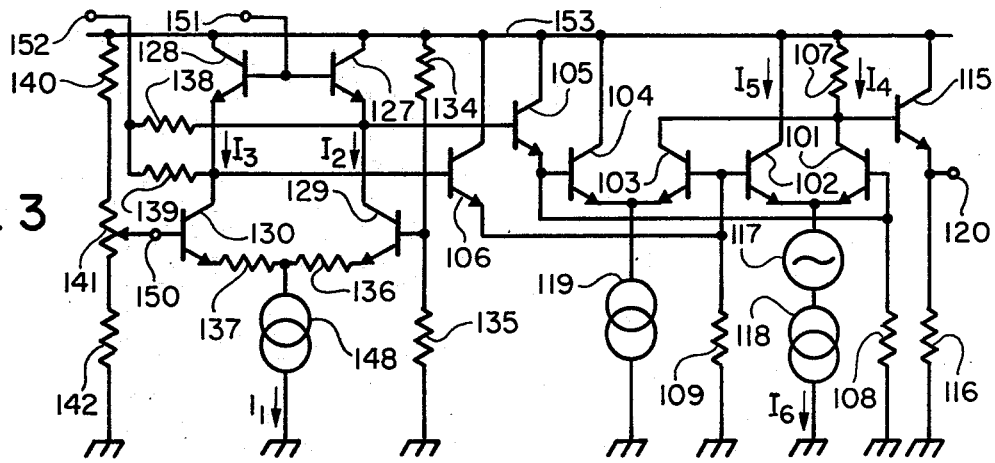
FIG. 3 is a circuit diagram illustrative of the first embodiment of the gain-controllable amplifier according to the present invention.

The first embodiment of the present invention will now be decribed in more detail with reference to FIG. 3.

Reference numerals 101 to 109, and 115 to 120 designate parts similar to those of reference numerals 1 to 9, and 15 to 20 in FIG. 1, being presented with 100 added thereto. The respective emitters of transistors 129 and 130 are connected by way of resistors 136, 137 to a contact current source 148, thereby constituting a differential amplifier circuit with transistors 127,128. The respective bases of transistors 127,128 are connnected to each other and in turn connected by way of a terminal 151 to a D.C. constant voltage source (not shown). The base of the transistor 129 is connected to a junction between resistors 134,135 which are connected between a power line 153 and the ground, while the base of transistor 130 is connected to a sliding terminal 150 of the variable resistor 141. The variable resistor 141 and resistors 140 and 142 are all connected in series between the electric power source line 153 and the ground. The respecitve collectors of transistors 129,130 are connected by way of resistors 138,139 to a terminal 152, respectively, while a constant voltage is applied to the terminal 152 from another D.C. constant voltage source (not shown). The voltage applied to the terminal 152 from above other D.C. constant voltage source should preferably be the sum of the forward direction voltage across the base-emitter of transistor and a constant voltage applied to the terminal 151. In the case of transistors made of silicon, for instance, a voltage of 0.7 to 0.8 V higher than the constant voltage applied to the terminal 151 is used, while respective currents following through the resistors 138,139 are selected.

Assume now that collector currents flowing through transistors 129,130 may supply base currents enough for operations of transistors 105,106, and that currents supply circuit consisting of resistors 138,139, may be neglected. Then, as has described earlier with reference to FIG. 2, there may be established the equation (7). In this respect, if the resistance value of resistor 137 or 136 is sufficiently large, an output gain will vary in proportion to the variation in resistance value between the sliding terminal 150 and the junction of the variable resistor 141 and the resistor 142. The resistance of the resistor 137 is preferably selected as 1 to 100 KΩ, while 2 KΩ is used in one embodiment.

Figure 5:
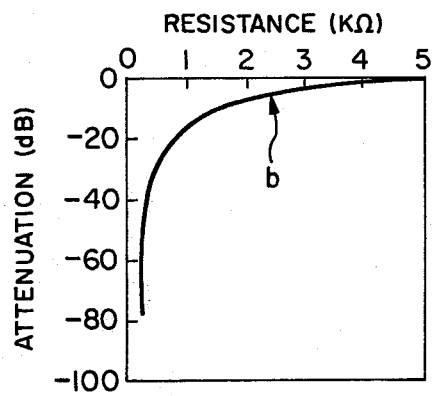

When either one of transistors 129 and 130 comes close to a saturated state, current $I_2$ or $I_3$ can no longer supply a base current to a transistor 105 or 106, then the base current may be supplied from a current supply circuit of resistor 138 or 139. As a result, currents flowing through transistor 127,128 are maintained to be equal to the currents $I_2$, $I_3$, respectively, thus maintaining the relationship represented by the equations (5) and (7). Accordingly, even if either one of transistors 129 and 130 comes close to an saturated or cut-off state, there may be obtained at an output terminal 120 an output which varies in proportion to the variation in resistance between the sliding terminal 150 and the junction of the resistor 142 and the variable resistor 141. The relationship between the gain and the above resistance is plotted in FIG. 5, in which an abscissa represents the above resistance, while an ordinate represents outputs obtained at the output terminal 120, the maximum output being given as 0dB. A point *b* shown is one, at which an output is reduced to half, i.e., −6dB. In this respect, the resistance is about 2.5 KΩ. As can be seen from this, the linearilty or proportionability of output to resistance may be well maintained.

In addition, the attenuation from the maximum value of output may be measured up to −80dB, while the attenuation beyond this point can no longer be measured, because of the confusion of internal noise which is unaboidable for an amplifier. The level of −80dB in the audio circuit is a sufficient attenuation enough to be inaudible by ears of a human being. Accordingly, the characteristics of this embodiment of the present invention are sufficiently suited for the gain control circuit of the audio signal.

Now, review will be given to a required Variable voltage range controlled by the sliding terminal 150. Assume a current $I_6$ generated from a constant current source 118. Then, for bringing the level of an output at a terminal 120 to its maximum, it is required that the collector current $I_4$ of the transistor 101 is brought to the current $I_6$ and the collector current $I_5$ of the transistor 102 to zero, respectively. To this end, however, the collector current $I_2$ of transistor 129 should be brought to zero, and the collector current $I_3$ of transistor 130 to a current $I_1$, respectively. On the other hand, for reducing the output level to half the maximum output, i.e., to −6dB, it is required that the respective collector currents $I_4$, $I_5$ of transistors 101,102 are adjusted to the half value of the current $I_6$, and the collector currents $I_2$, $I_3$ of transistors 129,130 to the half of the current $I_1$. Likewise, for bringing the output level to a negligible one, it is imperative that the collector current $I_4$ of transistor 101 is brought to zero, and the collector current $I_5$ of transistor 102 to a current $I_6$, respectively. Accordingly, the collector current $I_2$ of transistor 129 is required to be brought to the current $I_1$, and the collector current $I_3$ of transistor 130 to zero, respectively.

In this case, a base D.C. bais voltage on the transistor 130, which voltage appears at a terminal 150, should be set as follows:

In the case of a miximum output level:

$$V_{130MAX} = V_{129} + \frac{kT}{q} \ln \left( \frac{I_1}{I_s} + 1 \right) + I_1 R_E \quad (8),$$

in case the output level is attenuated from the maximum output to half (−6dB), $$V_{130\, -6dB} = V_{129} \quad (9),$$

and in the case of the output level being zero, $$V_{130MIN} = V_{129} - \frac{kT}{q} \ln \left( \frac{I_1}{I_s} + 1 \right) - I_1 R_E \quad (10),$$

where
$R_E$: respective resistances of the emitter resistor 136 and emitter resistor 137;
$V_{130MAX}$ : base bias voltage of transistor 130 at the maximum output level;
$V_{130-6dB}$ : a base bias voltage of transistor 130 at −6dB output level;
$V_{130MIN}$ : a base voltage of transistor 130 at zero output;
$V_{129}$ : a base bias voltage (fixed) of transistor 129
$I_s$ : saturation current on transistor 129 or 130.

Accordingly, for the purpose of adjusting an output level at the terminal 120 in a wide range, variable range $\Delta V$ at the terminal 150 should be determined based on the equations (8),(10), as follows:

$$\Delta V \geq V_{130MAX} - V_{130MIN} = \frac{2kT}{q} \ln \left( \frac{I_1}{I_s} + 1 \right) + 2I_1 R_E \quad (11)$$

Stated differently, if the variable range at the terminal 150 controlled by the variable resistor 141 is at least over $$\frac{2kT}{q} \ln \left( \frac{I_1}{I_s} + 1 \right) + 2I_1 R_E,$$

the output level may be adjusted in a range from the maximum to zero, in proportion to the variation in voltage at the terminal 150.

Accordingly, if the variable resistance range of variable resistor 141 is so selected as to obtain the aforesaid voltagle range and the characteristic of the resistance variation is suitably selected for the variable resistor 141, there results an advantage in that the adjustment of an output level may be smoothly and suitably made by a user. For instance, a circuit shown in FIG. 2 may be used as a volume adjusting circuit for an audio amplifier of a television reciever with a variable resistor of an 'A' type characteristic. Such audio amplifier has a characteristic of variation in an angle of rotation of the variable resistor relative to a voice signal output which is similar to that obtained in the prior art amplifier controlling its volume by a variable resistor alone. In addition, even if the variable resistor 141 is positioned apart from an amplifier, a noise introduced through wirings between the variable resistor 141 and the amplifier may be bypassed through a capacitor connected between the terminal 150 and earth, so that volume adjustment may be effected without being affected by the external noise. In this respect, the capacitance of the capacitor is preferably selected to 0.01 to 0.1 $\mu$F.

Furthermore, the gain controllable amplifier according to the present invention can be constructed in a semiconductor integrated circuit. In this case, transistors are provided in matched pairs, so that the characteristic will not be affected by a change in temperature. Particularly, the respective base D.C. bias voltages on transistors 129, 130 depend respectively on the ratio in resistance of the diffusion resistors 134,135 formed in the integrated circuit, and on the ratio in resistance obtained in the series circuit of external carbon resistors 140,142, and carbon variable resistor 141. These ratios are free from a change in temperature, with the accompanying unwanted variation in the gain.

Figure 6:
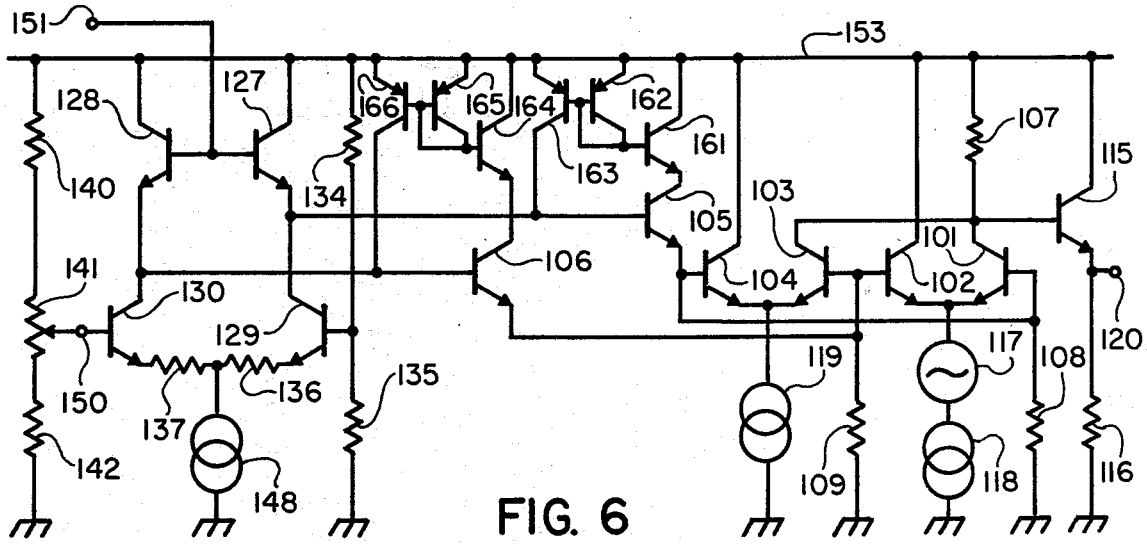
FIG. 6 is a circuit diagram showing the second embodiment of the present invention.

The second embodiment of the present invention will be described in conjunction with FIG. 6, hereunder. The essential part of the second embodiment is the same as that of the first embodiment of FIG. 3, except that a current supply circuit for resistors 138,139 in FIG. 3 are formed by using transistors 161 to 166. More specifically, emitter and collector of transistor 161 (164) are connected to the collector of a transistor 105 (106) and an electric power line 153, respectively, the base of the transistor 161 (164) to the junction of the collector and the base of transistor 162 (165), the respective emitters of the transistors 162 (165), 163 (166) to the power supply line 153, and the collector of transistor 163 (166) to the base of the transistor 105 (106).

With this second embodiment, a base current of transistor 105 (106) may be supplied through the emitter-collector path of the transistor 163 (166). The current supplied through transistor 163 (166) is controlled by the transistor 162 (165) so that it may be similar to the base current of the transistor 161 (164). The collector currents of transistors 161 (164) and 105 (106) are nearly the same. Therefore, the required base current for the transistors 105 (106) is always supplied through transistor 163 (166), even when either one of transistors 129 and 130 saturates to cutoff condition. In addition, there is required no special D.C. constant voltage source for supplying a current to the current supply circuit.

Meanwhile, the constant current sources 118,119,148 may be provided in the form of resistors connected between the both terminals. Alternatively, the collector of a transistor having emitter resistance may be connected to a common electrode (e.g. a junction of the emitters of transistors 101 and 102 or transistors 103 and 104 and a junction of resistors 136 and 137), thereby impressing a constant voltage on the base of this transistor.

What is claimed is:

1. An amplifier comprising:
    a differential amplifier having a common electrode terminal, first and second bias terminals and an output terminal;
    means for applying an input signal to said common electrode terminal of said differential amplifier;
    first and second transistors whose emitters are connected to said first and second bias terminals, respectively;
    third and fourth transistors whose collectors are connected to the respective bases of said first and second transistors;
    a constant current source coupled to the respective emitters of said third and fourth transistors;
    fifth and sixth transistors whose emitters are connected to the respective collectors of said third and fourth transistors;
    a constant voltage source connected to the bases of said fifth and sixth transistors;
    a bias voltage source impressing a constant voltage on the base of said third transistor;
    means for applying bias voltage to the base of said fourth transistor; and
    first and second current supply sources for supplying currents to said first and second transistors, respectively.

2. An amplifier claimed in claim 1, wherein said first and second current supply sources comprises respectively first and second resistors connected between a voltage supply terminal and respective bases of said first and second transistors.

3. An amplifier claimed in claim 1, wherein said first and second current supply sources comprise:
    i. seventh and eighth transistors whose emitters are connected to the respective collectors of said first and second transistors and whose collectors are connected to a power supply line, respectively;
    ii. ninth and tenth transistors whose bases and collectors are connected to the respective bases of said seventh and eighth transistors, and whose emitters are connected to said power supply line, respectivley; and
    iii. eleventh and twelveth transistors, whose bases are connected to the respective junctions of the bases and collectors and said ninth and tenth transistors, whose emitters are connected to said power supply line, and whose collectors are connected to the respective bases of said first and second transistors, respectively.

4. An amplifier claimed in claim 1, further comprising: a second differential amplifier including a common electrode terminal, first and second bias teminals and an output terminal, said first and second transistors being connected to said second and first bias terminals of said second differential amplifier, respectively, and the output terminals of said first and second differential amplifiers being commonly connected with each other, whereby the D.C. potential of an output may not be affected by the adjustment of a gain.

5. An amplifier claimed im claim 4, wherein a capacitive element of 0.01 to 0.1 $\mu$F is connected between the base of said fourth transistor and earth potential.

* * * * *

UNITED STATES PATENT OFFICE
CERTIFICATE OF CORRECTION

Patent No. 4,013,972     Dated March 22, 1977

Inventor(s) Shigeo Nishitoba et al.

It is certified that error appears in the above-identified patent and that said Letters Patent are hereby corrected as shown below:

In the Title Box

Assignee: change "Nippon Electric Company, Ltd." to
-- Nippon Electric Co., Ltd. --;

In the Claims

Column 10, Claim 4, Line 21, change "teminals" (second occurrence) to -- terminals --.

Signed and Sealed this

Twenty-fourth Day of May 1977

[SEAL]

Attest:

RUTH C. MASON
Attesting Officer

C. MARSHALL DANN
Commissioner of Patents and Trademarks